(12) United States Patent
Zhang et al.

(10) Patent No.: US 10,886,368 B2
(45) Date of Patent: Jan. 5, 2021

(54) I/O DEVICE SCHEME FOR GATE-ALL-AROUND TRANSISTORS

(71) Applicant: International Business Machines Corporation, Armonk, NY (US)

(72) Inventors: Jingyun Zhang, Albany, NY (US); Alexander Reznicek, Troy, NY (US); Choonghyun Lee, Rensselaer, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 16/108,567

(22) Filed: Aug. 22, 2018

(65) Prior Publication Data

US 2020/0066839 A1 Feb. 27, 2020

(51) Int. Cl.
| | |
|---|---|
| *H01L 29/06* | (2006.01) |
| *H01L 29/66* | (2006.01) |
| *H01L 29/786* | (2006.01) |
| *H01L 21/8234* | (2006.01) |
| *H01L 21/02* | (2006.01) |

(52) U.S. Cl.
CPC .... *H01L 29/0673* (2013.01); *H01L 21/02603* (2013.01); *H01L 21/823412* (2013.01); *H01L 29/66439* (2013.01); *H01L 29/66613* (2013.01); *H01L 29/78618* (2013.01); *H01L 29/78696* (2013.01)

(58) Field of Classification Search
CPC ........... H01L 29/0673; H01L 29/66439; H01L 29/66613; H01L 29/78618; H01L 29/78696; H01L 21/02603; H01L 21/823412
See application file for complete search history.

(56) References Cited

U.S. PATENT DOCUMENTS

| | | | |
|---|---|---|---|
| 8,936,972 B2 | 1/2015 | Bangsaruntip et al. | |
| 9,935,014 B1 | 4/2018 | Cheng et al. | |
| 10,014,390 B1 * | 7/2018 | Bouche | H01L 29/0665 |
| 2012/0007051 A1 * | 1/2012 | Bangsaruntip | B82Y 10/00 |
| | | | 257/24 |
| 2017/0140933 A1 | 5/2017 | Lee et al. | |
| 2017/0154960 A1 | 6/2017 | Rachmady et al. | |
| 2017/0194143 A1 | 7/2017 | Balakrishnan et al. | |
| 2017/0200738 A1 * | 7/2017 | Kim | H01L 27/1203 |

* cited by examiner

*Primary Examiner* — Dale E Page
*Assistant Examiner* — Quovaunda Jefferson
(74) *Attorney, Agent, or Firm* — Scully, Scott, Murphy & Presser, P.C.; L. Jeffrey Kelly, Esq.

(57) ABSTRACT

An I/O device nanosheet material stack of suspended semiconductor channel material nanosheets is provided above a semiconductor substrate. A physically exposed portion of each suspended semiconductor channel material nanosheet is thinned to increase the inter-nanosheet spacing between each vertically stacked semiconductor channel material nanosheet. An I/O device functional gate structure is formed wrapping around the thinned portion of each suspended semiconductor channel material nanosheet.

12 Claims, 13 Drawing Sheets

US 10,886,368 B2

I/O DEVICE SCHEME FOR GATE-ALL-AROUND TRANSISTORS

BACKGROUND

The present application relates to a semiconductor structure and a method of forming the same. More particularly, the present application provides a semiconductor structure (i.e., input/output (I/O) device) having improved inter-nanosheet spacing between each semiconductor channel material nanosheet of a plurality of stacked and suspended semiconductor channel material nanosheets, as well as a method of forming the same, which method is compatible with nominal logic device processing.

The use of non-planar semiconductor devices such as, for example, nanosheet containing devices has been touted as a viable option for the 5 nm or beyond technology node. By "nanosheet containing device" it is meant that the device contains one or more layers of semiconductor channel material portions having a vertical thickness that is substantially less than its width. Nanosheet formation relies on the selective removal of one semiconductor material relative to another semiconductor material to form suspended nanosheets for gate-all-around transistors.

Gate-all-around transistors including semiconductor channel material nanosheets can provide better electrostatic control in order to meet the requirement for further aggressive device scaling. Such gate-all-around transistors are important for input/output (I/O) devices. However, I/O devices need a thick gate dielectric material in order to meet requirements for large voltage drop. The limited inter-nanosheet spacing between each semiconductor channel material nanosheet of an I/O device cannot allow thick gate dielectric material deposition.

There is thus a need for providing an I/O device having improved inter-nanosheet spacing between each semiconductor channel material nanosheet of a plurality of stacked and suspended semiconductor channel material nanosheets, which can accommodate a thick gate dielectric material, and which can be formed using processing steps that are compatible with nominal logic device processing.

SUMMARY

An I/O device nanosheet material stack of suspended semiconductor channel material nanosheets is provided above a semiconductor substrate. A physically exposed portion of each suspended semiconductor channel material nanosheet is thinned to increase the inter-nanosheet spacing between each vertically stacked semiconductor channel material nanosheet. An I/O device functional gate structure is formed wrapping around the thinned portion of each suspended semiconductor channel material nanosheet.

In one aspect of the present application, a semiconductor structure (i.e., I/O device) is provided that has improved inter-nanosheet spacing between each semiconductor channel material nanosheet of a plurality of stacked and suspended semiconductor channel material nanosheets. In one embodiment, the semiconductor structure includes a plurality of stacked and suspended first semiconductor channel material nanosheets located above a semiconductor substrate and present in an I/O device region. Each first semiconductor channel material nanosheet has a channel region having a thickness that is less than a thickness of each end region of the first semiconductor channel material nanosheet. An I/O device functional gate structure wraps around the channel region of each first semiconductor channel material nanosheet of the plurality of stacked and suspended first semiconductor channel material nanosheets, and a source/drain (S/D) structure is located on each side of the I/O device functional gate structure and physically contacts sidewalls of each first semiconductor channel material nanosheet of the plurality of stacked and suspended first semiconductor channel material nanosheets.

In another aspect of the present application, a method of forming a semiconductor structure (i.e., I/O device) is provided which enables the formation of a thick gate dielectric material between each semiconductor channel material nanosheet of a plurality of stacked and suspended semiconductor channel material nanosheets. In one embodiment, the method includes forming an I/O device nanosheet material stack of alternating nanosheets of a first sacrificial semiconductor material and a first semiconductor channel material on a surface of a semiconductor substrate and beneath a sacrificial gate structure and a dielectric material spacer. Each first sacrificial semiconductor material nanosheet of the I/O device nanosheet material stack is recessed to provide a gap above and beneath each first semiconductor channel material nanosheet. An inner dielectric spacer is formed in each of the gaps, and then a source/drain structure is formed from physically exposed sidewalls of each first semiconductor channel material nanosheet. Next, the sacrificial gate structure and each recessed first sacrificial semiconductor material nanosheet of the I/O device nanosheet material stack are removed to provide a gate cavity and to suspend each first semiconductor channel material nanosheet. A physically exposed portion of each suspended first semiconductor channel material nanosheet is then thinned, and thereafter an I/O device functional gate structure is formed in the gate cavity and wrapping around the thinned portion of each suspended first semiconductor channel material nanosheet.

DETAILED DESCRIPTION

Figure 1:
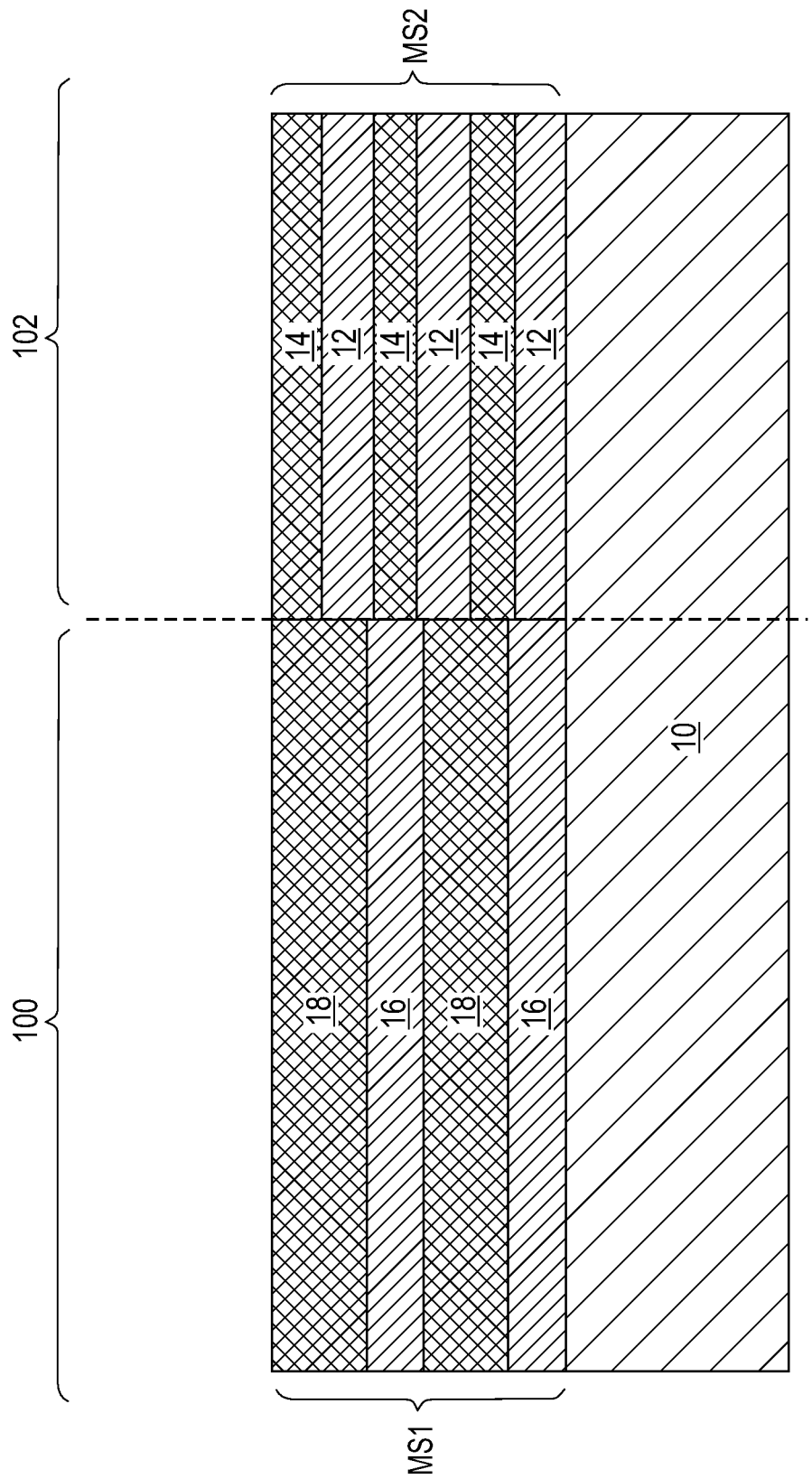
FIG. 1 is a cross sectional view of an exemplary semiconductor structure including an I/O device semiconductor material stack structure of alternating layers of a first sacrificial semiconductor material having a first thickness and a first semiconductor channel material having a first thickness located on a first portion of a semiconductor substrate and in an I/O device region, and a logic device semiconductor material stack structure of alternating layers of a second sacrificial semiconductor material having a second thickness and a second semiconductor channel material having a second thickness located on a second portion of the semiconductor substrate and in a logic device region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including an I/O device semiconductor material stack structure, MS1, of alternating layers of a first sacrificial semiconductor material 16 having a first thickness and a first semiconductor channel material 18 having a first thickness located on a first portion of a semiconductor substrate 10 and in an I/O device region 100, and a logic device semiconductor material stack structure, MS2, of alternating layers of a second sacrificial semiconductor material 12 having a second thickness and a second semiconductor channel material 14 having a second thickness located on second portion of the semiconductor substrate 10 and in a logic device region 102. In the present application, the first thickness of each layer of the first semiconductor channel material 16 is greater than the second thickness of each layer of the second semiconductor channel material 14. Thus, the I/O device semiconductor material stack structure, MS1, includes fewer material layers than the logic device semiconductor material stack structure.

The I/O device region 100 is laterally adjacent to the logic device region 102. In some embodiments, the I/O device region 100 may be located immediately adjacent to the logic device region 102. In other embodiments, a gap may be present between the I/O device region 100 and the logic device region 102. In some embodiments of the present application, the logic device region 102 can be omitted.

The I/O device region 100 denotes a device region in which the device channel is greater than 100 nm. In some embodiments, the device channel within the I/O device region 100 may be from 110 nm to 300 nm. The logic device region 102 is a device region in which the device channel is from 100 nm or less. In some embodiments, the device channel within the logic device region 102 is from 10 nm to 50 nm.

The term "semiconductor material stack structure" denotes a continuous fin-like structure including a pair of vertical sidewalls that are parallel to each other. As used herein, a surface is "vertical" if there exists a vertical plane from which the surface does not deviate by more than three times the root mean square roughness of the surface. The I/O device semiconductor material stack structure, MS1, and the logic device semiconductor material stack structure, MS2, may have a height from 50 nm to 200 nm, a width from 30 nm to 200 nm, and a length from 100 nm to 2000 nm. Other heights and/or widths and/or lengths may also be used as the dimensions of the semiconductor material stack structure. The height of the I/O device semiconductor material stack structure, MS1, is typically the same as the height of the logic device semiconductor material stack structure, MS2. In such an embodiment, the I/O device semiconductor material stack structure, MS1, has a topmost surface that is coplanar with a topmost surface of the logic device semiconductor material stack structure, MS2.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 is a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator (SOI) substrate. A SOI substrate typically includes a handle substrate, an insulator layer and a topmost semiconductor material layer. In some embodiments, the handle substrate of the SOI substrate may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

The I/O device semiconductor material stack structure, MS1, is composed of alternating layers of a first sacrificial semiconductor material 16 having a first thickness and a first semiconductor channel material 18 having a first thickness. In the present application, the I/O device semiconductor material stack structure, MS1, includes at least 2n layers of the first semiconductor channel material 18 (wherein n is an integer of greater than, or equal, to 1), and 2n layers of the first sacrificial semiconductor material 16. In one example, the I/O device semiconductor material stack structure, MS1, includes two layers of the first sacrificial semiconductor material 16 and two layers of semiconductor channel material 18.

Each layer of the first sacrificial semiconductor material 16 of the I/O device semiconductor material stack structure, MS1, is composed of a semiconductor material which differs in composition from an upper semiconductor material portion of the semiconductor substrate 10. In one embodiment, each layer of first sacrificial semiconductor material 16 is composed of a silicon germanium alloy. In such an embodiment, the silicon germanium alloy that provides each layer of the first sacrificial semiconductor material 16 may have a germanium content from 20 atomic percent to 40 atomic percent. Each layer of the first sacrificial semiconductor material 16 can be formed utilizing an epitaxial growth (or deposition) process, as will be defined in greater detail herein below.

Each layer of the first semiconductor channel material 18 (which may be also referred to as a I/O device semiconductor channel material) of the I/O device semiconductor material stack structure, MS1, is composed of a semiconductor material that has a different etch rate than the semiconductor material that provides each layer of the first sacrificial semiconductor material 16. In one example, each layer of the first semiconductor channel material 18 is composed of silicon or a III-V compound semiconductor, while each layer of the first sacrificial semiconductor material 16 is composed of a silicon germanium alloy. Each layer of the first semiconductor channel material 18 can be formed utilizing an epitaxial growth (or deposition) process as will be defined in greater detail herein below.

Each layer of the first sacrificial semiconductor material 16 (which also may be referred to as an I/O device sacrificial semiconductor material) of the I/O device semiconductor material stack structure, MS1, has a first thickness which may be from 5 nm to 12 nm, while each layer of the first semiconductor channel material 18 of the I/O device semiconductor material stack structure, MS1, has a first thickness from 5 nm to 20 nm. It is noted that the first thickness of each layer of the first semiconductor channel material 18 of the I/O device semiconductor material stack structure, MS1, is greater than the second thickness of each layer of second semiconductor channel material 14 of the logic device semiconductor material stack structure, MS2.

The logic device semiconductor material stack structure, MS2, is composed of alternating layers of a second sacrificial semiconductor material 12 having a second thickness and a second semiconductor channel material 14 having a second thickness. In the present application, the logic device semiconductor material stack structure, MS2, also includes at least 2n layers of the second semiconductor channel material 14 (wherein n is an integer of greater than, or equal, to 1), and 2n layers of the second sacrificial semiconductor material 12. In one example, the logic device semiconductor material stack structure, MS2, includes three layers of the second sacrificial semiconductor material 12 and three layers of semiconductor channel material 14.

Each layer of the second sacrificial semiconductor material 12 (which also may be referred to as a logic device sacrificial semiconductor material) of the logic device semiconductor material stack structure, MS2, is composed of a same, or a different, semiconductor material as each layer of the first sacrificial semiconductor material 16 of the I/O device semiconductor material stack structure, MS1. In one embodiment, each layer of the second sacrificial semiconductor material 12 of the logic device semiconductor material stack structure, MS2, and each as each layer of the first sacrificial semiconductor material 16 of the I/O device semiconductor material stack structure, MS1, are composed of a silicon germanium alloy having a same germanium content. Each layer of the second sacrificial semiconductor material 12 of the logic device semiconductor material stack structure, MS2, may be formed utilizing an epitaxial growth (or deposition) process as will be defined in greater detail herein below. Each layer of the second sacrificial semiconductor material 12 of the logic device semiconductor material stack structure, MS2, has a second thickness that is with the range of 5 nm to 12 nm. In some embodiments, the second thickness of each layer of the second sacrificial semiconductor material 12 of the logic device semiconductor material stack structure, MS2, is the same as the first thickness of each layer of the first sacrificial semiconductor material 16 of the I/O device semiconductor material stack structure, MS1.

Each layer of the second semiconductor channel material 14 (which also may be referred to as a logic device semiconductor channel material) of the logic device semiconductor material stack structure, MS2, is composed of a semiconductor material that has a different etch rate than the semiconductor material that provides each layer of the second sacrificial semiconductor material 12. In some embodiments, each layer of the second semiconductor channel material 14 is composed of a same semiconductor material (e.g., silicon or a III-V compound semiconductor) as each layer of the first semiconductor channel material 18. In other embodiments, each layer of the second semiconductor channel material 14 is composed of a different semiconductor material as each layer of the first semiconductor channel material 18.

Each layer of the second semiconductor channel material 14 can be formed utilizing an epitaxial growth (or deposition) process as will be defined in greater detail herein below. Each layer of the second semiconductor channel material 14 of the logic device semiconductor material stack structure, MS2, has a second thickness which is less than a first thickness of each layer of the first semiconductor channel material 18 of the I/O device semiconductor material stack structure, MS1. In one embodiment, each layer of the second semiconductor channel material 14 of the logic device semiconductor material stack structure, MS2, has a second thickness which is from 5 nm to 12 nm.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. A number of well known source gases may be used for the epitaxial growth of the first and second sacrificial semiconductor materials (16, 12) and the first and second semiconductor channel materials (18, 14). Carrier gases like hydrogen, nitrogen, helium and argon can be used.

In one embodiment, the exemplary structure of FIG. 1 can be formed by first providing a semiconductor material stack composed of alternating layers of the second sacrificial semiconductor material 12 having the second thickness, and the second semiconductor channel material 14 having the second thickness in both the I/O device region 100 and the logic device region 102. Such a semiconductor material stack may be formed by epitaxial growth of the various layers. Next, a block mask is formed over this semiconductor material stack in the logic device region 102, and thereafter the entirety of this semiconductor material stack in the I/O device region 100 is removed by etching and replaced with an I/O semiconductor material stack containing alternating layers of the first sacrificial semiconductor material 16 having the first thickness and first semiconductor channel material 18 have the first thickness. The I/O semiconductor material stack can be formed by epitaxial growth of the various material layers. The two material stack structures are then patterned to provide the I/O device material stack structure, MS1, and the logic device material stack structure, MS2. Patterning may be performed by lithography and etching or any other patterning method known to those skilled in the art including, for example, a sidewall-image transfer (SIT) process.

In another embodiment, the exemplary structure of FIG. 1 can be formed by first providing an I/O semiconductor material stack composed of alternating layers of the first sacrificial semiconductor material 16 having the first thickness, and the first semiconductor channel material 18 having the first thickness in both the I/O device region 100 and the logic device 102. Such a semiconductor material stack may be formed by epitaxial growth of the various layers. Next, a block mask is formed over this semiconductor material stack in the I/O device region 100, and thereafter the entirety of this semiconductor material stack in the logic region 102 is removed by etching and replaced with a logic semiconductor material stack that includes alternating layers of the second sacrificial semiconductor material 12 having the first thickness and the second semiconductor channel material 14 having the first thickness. The logic semiconductor material stack can be formed by epitaxial growth of the various material layers. The two material stack structures are then patterned to provide the I/O device material stack structure, MS1, and the logic device material stack structure, MS2. Patterning may be performed by lithography and etching or any other patterning method known to those skilled in the art including, for example, a sidewall-image transfer (SIT) process.

Figure 2:
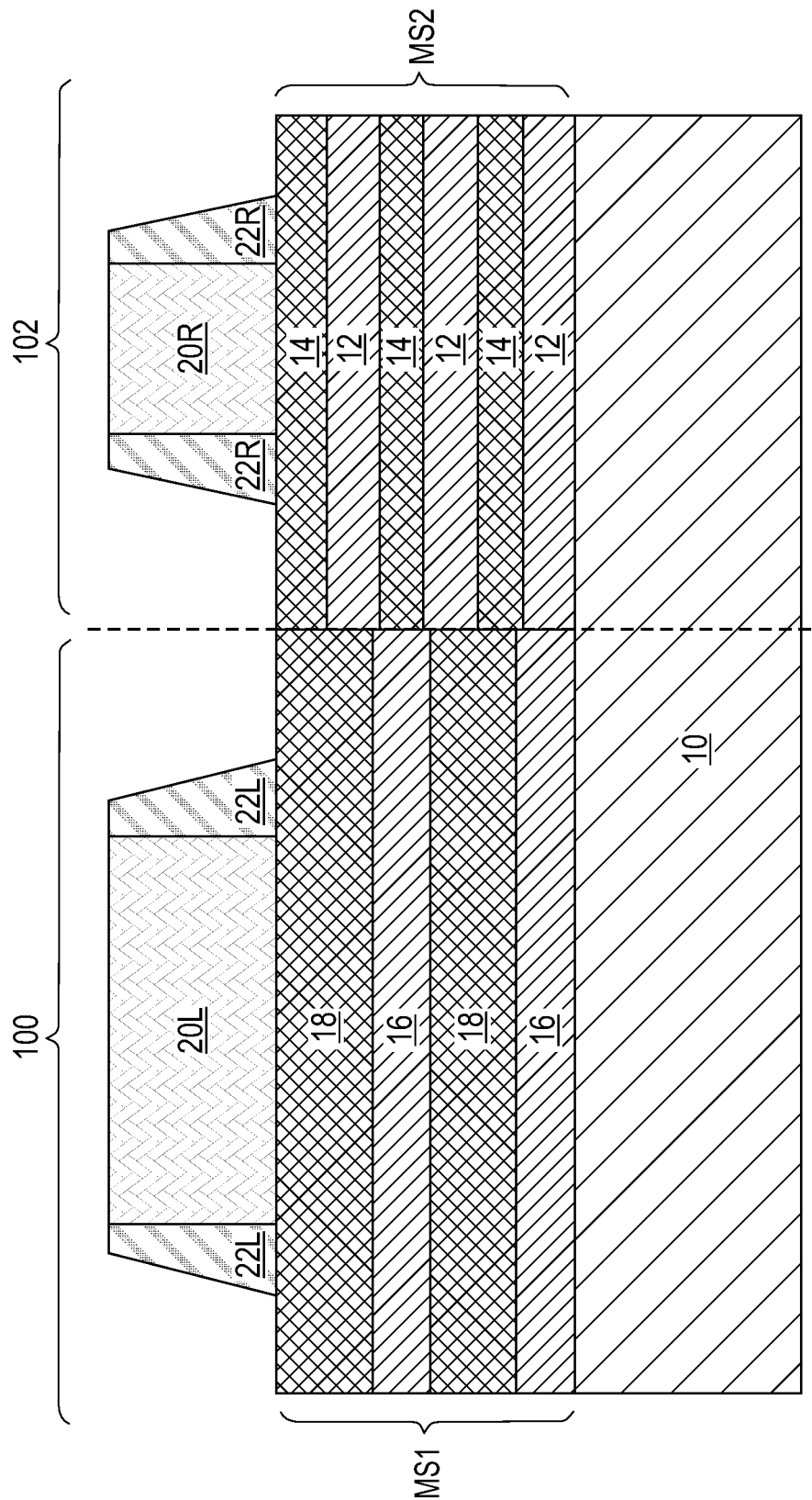
FIG. 2 is a cross sectional view of the exemplary semiconductor structure of FIG. 1 after forming a first sacrificial gate structure and a first dielectric material spacer on the I/O device semiconductor material stack structure in the I/O device region, and a second sacrificial gate structure and a second dielectric material spacer on the logic device semiconductor material stack structure in the logic device region.

Referring now to FIG. 2, there is illustrated the exemplary semiconductor structure of FIG. 1 after forming a first sacrificial gate structure 20L and a first dielectric material spacer 22L on the I/O device semiconductor material stack structure, MS1, in the I/O device region 100, and a second sacrificial gate structure 20R and a second dielectric material spacer 22R on the logic device semiconductor material stack structure, MS2, in the logic device region 102.

The first sacrificial gate structure 20L is located on a first side and a second side of the I/O device semiconductor material stack structure, MS1, and spans across a topmost surface of a portion of the I/O device semiconductor material stack structure, MS1. The first sacrificial gate stack structure 20L thus straddles over a portion of the I/O device semiconductor material stack structure, MS1. The second sacrificial gate structure 20R is located on a first side and a second side of the logic device semiconductor material stack structure, MS2, and spans across a topmost surface of a portion of the logic device semiconductor material stack structure, MS2. The second sacrificial gate stack structure 20R thus straddles over a portion of the logic device semiconductor material stack structure, MS1.

The first and second sacrificial gate structures (20L, 20R) may include a single sacrificial material or a stack of two or more sacrificial materials (i.e., first and second sacrificial gate structures (20L, 20R) includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the first and second sacrificial gate structures (20L, 20R). As is shown, the first sacrificial gate structure 20L has a longer width than the second sacrificial gate structure 20R. In one example, the first sacrificial gate structure 20L has a width greater than 100 nm, while the second sacrificial gate structure 20R has a width of 100 nm or less. In some embodiments, the first sacrificial gate structure 20L may be from 110 nm to 300 nm, while the second sacrificial gate structure 20R may have a width from 10 nm to 50 nm.

The first and second dielectric material spacers (22L, 22R) can be formed by deposition of a dielectric spacer material and then etching the dielectric spacer material. One example of a dielectric spacer material that may be employed in the present application is silicon nitride. The deposition process that can be employed in providing the dielectric spacer material includes, for example, chemical vapor deposition (CVD), plasma enhanced chemical vapor deposition (PECVD), or physical vapor deposition (PVD). The etch used to etch the deposited dielectric spacer material may comprise a dry etching process such as, for example, reactive ion etching.

Figure 3:
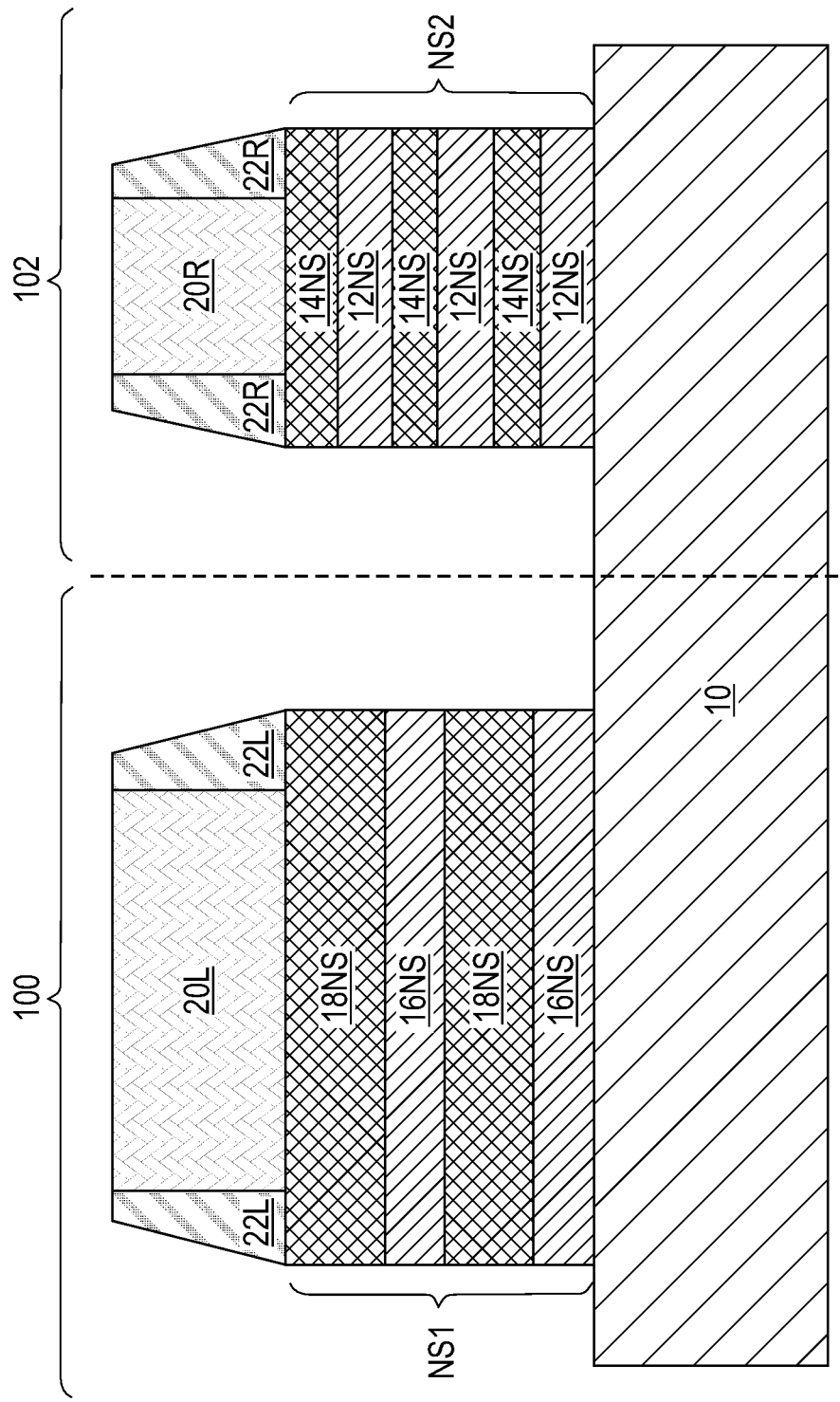
FIG. 3 is a cross sectional view of the exemplary semiconductor structure of FIG. 2 after removing physically exposed portions of the I/O device semiconductor material stack structure that are not protected by first sacrificial gate structure and the first dielectric material spacer, and the physically exposed portions of the logic device semiconductor material stack structure that are not protected by second sacrificial gate structure and the second dielectric material spacer to provide an I/O device nanosheet material stack located beneath the first sacrificial gate structure and the first dielectric material spacer, and a logic device nanosheet material stack located beneath the second sacrificial gate structure and the second dielectric material spacer, respectively.

Referring now to FIG. 3, there is illustrated the exemplary semiconductor structure of FIG. 2 after removing physically exposed portions of the I/O device semiconductor material stack structure, MS1, that are not protected by first sacrificial gate structure 20L and the first dielectric material spacer 22L and the physically exposed portions of the logic device semiconductor material stack structure, MS2, that are not protected by second sacrificial gate structure 20R and the second dielectric material spacer 22R to provide a I/O device nanosheet material stack, NS1, located beneath the first sacrificial gate structure 20L and the first dielectric material spacer 22R, and a logic device nanosheet material stack, NS2, located beneath the second sacrificial gate structure 20R and the second dielectric material spacer 22R.

The removal of the physically exposed portions of the I/O device and logic device semiconductor material stack structures (MS1, MS2) that are not protected by first and second sacrificial gate structures (20L, 20R) and the first and second dielectric material spacers (22L, 22R), respectively can be performed utilizing an anisotropic etching process such as, for example, reactive ion etching (RIE). The etching process stops on the semiconductor substrate 10.

A portion of the I/O device semiconductor material stack structure, MS1, remains beneath the first sacrificial gate structure 20L and the first dielectric material spacer 22L, and a portion of the logic device semiconductor material stack structure, MS2, remains beneath the second sacrificial gate structure 20R and the second dielectric material spacer 22R. The remaining portion of the I/O device semiconductor material stack structure that is presented beneath the first sacrificial gate structure 20L and the first dielectric material spacer 22L can be referred to as an I/O device nanosheet material stack, NS1, while the remaining portion of the logic device semiconductor material stack structure that is presented beneath the second sacrificial gate structure 20R and the second dielectric material spacer 22R can be referred to as a logic device nanosheet material stack, NS2.

The I/O device nanosheet material stack, NS1, includes alternating nanosheets of a remaining portion of each layer of first sacrificial semiconductor material 16 (referred to herein as a first sacrificial semiconductor material nanosheet 16NS) and a remaining portion of each layer of first semiconductor channel material 18 (referred to herein as a first semiconductor channel material nanosheet 18NS). Each nanosheet, i.e., first sacrificial semiconductor material nanosheet 16NS and first semiconductor channel material nanosheet 18NS, that constitutes the I/O device nanosheet material stack, NS1, has a thickness as mentioned above for the individual layers of first sacrificial semiconductor material 16 and layers of first semiconductor channel material 18 of the I/O device semiconductor material stack structure, MS1, and a width that is typically greater than 100 nm to 300 nm. At this point of the present application and as illustrated in FIG. 3, the sidewalls of each first sacrificial semiconductor material nanosheet 16NS are vertically aligned to sidewalls of each first semiconductor channel material nanosheet 18NS.

The logic device nanosheet material stack, NS2, includes alternating nanosheets of a remaining portion of each layer of second sacrificial semiconductor material 12 (referred to herein as a second sacrificial semiconductor material nanosheet 12NS) and a remaining portion of each layer of second semiconductor channel material 14 (referred to herein as a second semiconductor channel material nanosheet 14NS). Each nanosheet, i.e., second sacrificial semiconductor material nanosheet 12NS and second semiconductor channel material nanosheet 14NS, that constitutes the logic device nanosheet material stack, NS2, has a thickness as mentioned above for the individual layers of second sacrificial semiconductor material 12 and layers of second semiconductor channel material 14 of the logic device semiconductor material stack structure, MS2, and a width that is less than the width of each nanosheet that constitutes the I/O device nanosheet material stack, NS1. In one example, the width of each nanosheet (12NS/14NS) in the logic device nanosheet material stack, NS2, is from 10 nm to 50 nm. At this point of the present application and as illustrated in FIG. 3, the sidewalls of each second sacrificial semiconductor material nanosheet 12NS are vertically aligned to sidewalls of each second semiconductor channel material nanosheet 14NS.

Figure 4:
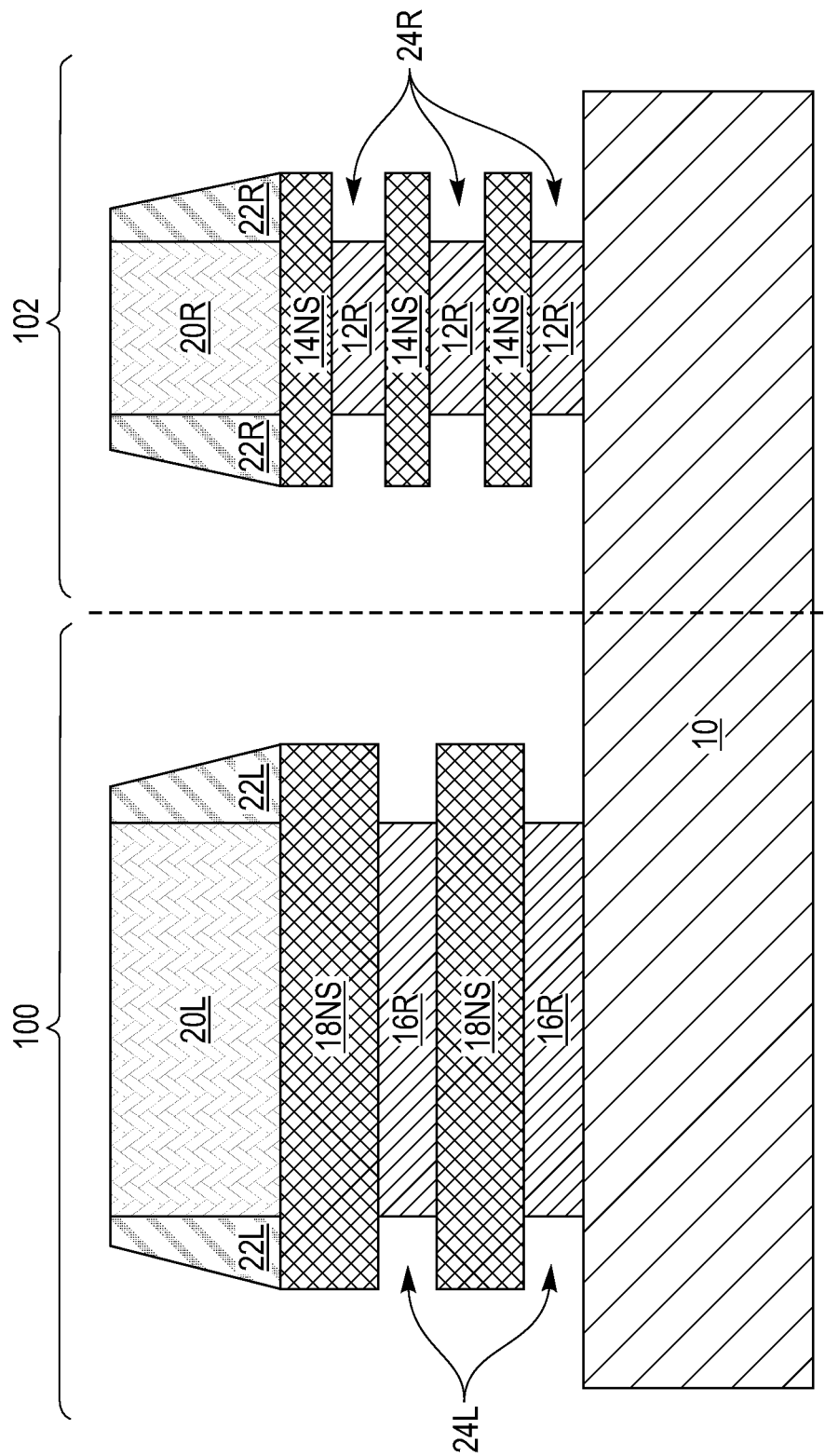
FIG. 4 is a cross sectional view of the exemplary semiconductor structure of FIG. 3 after recessing each first sacrificial semiconductor material nanosheet of the I/O device nanosheet material stack, and each second sacrificial semiconductor material nanosheet of the logic device nanosheet material stack.

Referring now to FIG. 4, there is illustrated the exemplary semiconductor structure of FIG. 3 after recessing each first sacrificial semiconductor material nanosheet 16NS of the I/O device nanosheet material stack, NS1, and each second sacrificial semiconductor material nanosheet 12NS of the logic device nanosheet material stack, NS2. The recessing of each first sacrificial semiconductor material nanosheet 16NS of the I/O device nanosheet material stack, NS1, and the recessing of each second sacrificial semiconductor material nanosheet 12NS of the logic device nanosheet material stack, NS2, may be performed utilizing a lateral etching process that is selective in removing physically exposed end portions of each sacrificial semiconductor material nanosheet (16NS, 12NS) relative to each semiconductor channel material nanosheet (18NS, 14NS).

Each recessed first sacrificial semiconductor material nanosheet, designated as 16R, has a width that is less than the original width of each first sacrificial semiconductor material nanosheet 16NS, and each recessed second sacrificial semiconductor material nanosheet, designated as 12R, has a width that is less than the original width of each second sacrificial semiconductor material nanosheet 16R. The recessing of each first sacrificial semiconductor material nanosheet 16NS provides a first gap 24L between each neighboring pair of first semiconductor channel material nanosheets 18NS in the I/O device nanosheet material stack, NS1; a first gap 24L is also formed between the bottommost first semiconductor channel material nanosheet 18NS and the semiconductor substrate 10. The recessing of each second sacrificial semiconductor material nanosheet 12R provides a second gap 24R between each neighboring pair of second semiconductor channel material nanosheets 18NS in the logic device nanosheet material stack, NS2, and a second gap 24R is also located beneath the bottommost second semiconductor channel material nanosheet 14NS and the semiconductor substrate 10.

Figure 5:
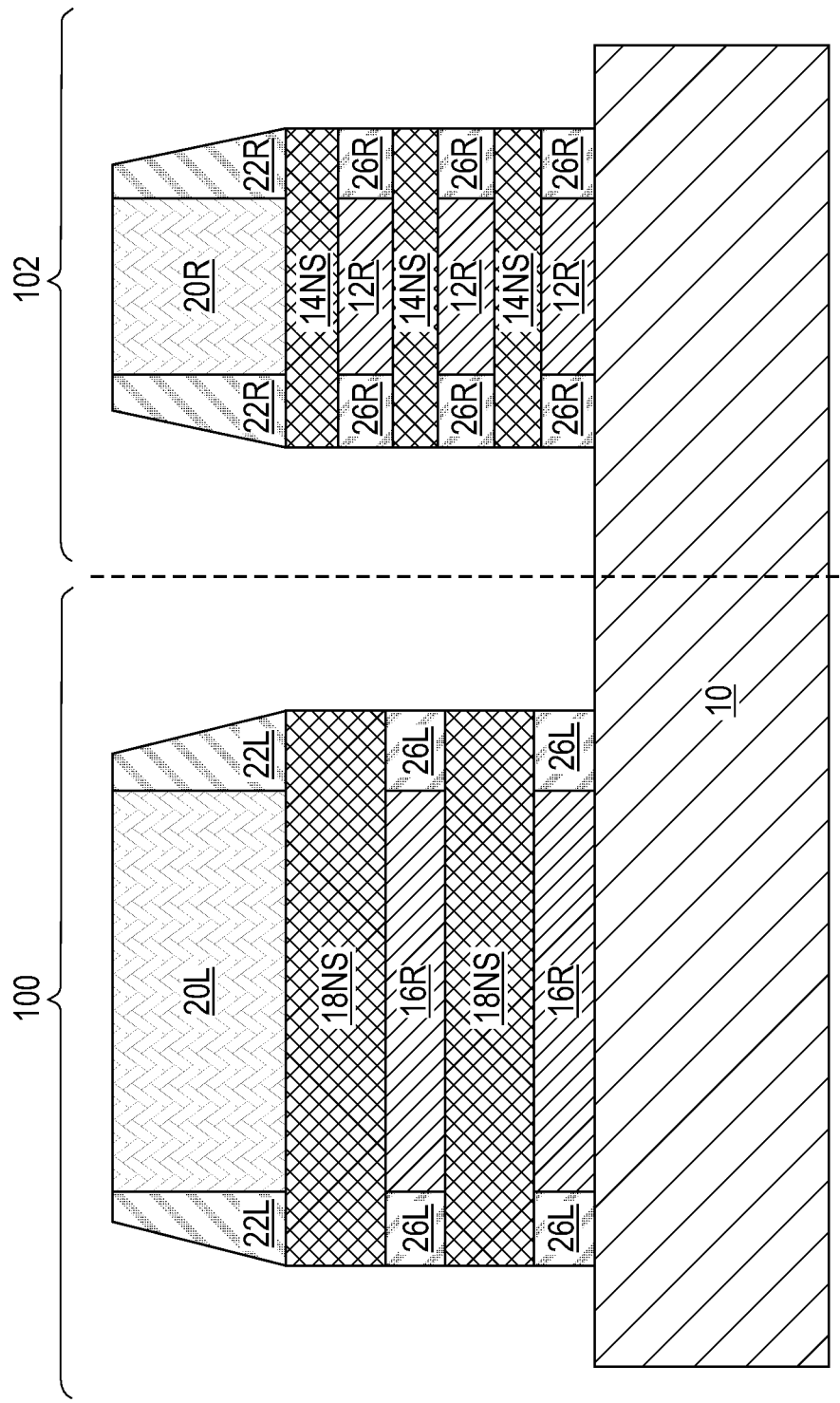
FIG. 5 is a cross sectional view of the exemplary semiconductor structure of FIG. 4 after forming a first inner dielectric spacer on exposed sidewalls of each recessed first sacrificial semiconductor material nanosheet of the I/O device nanosheet material stack, and a second inner dielectric spacer on exposed sidewalls of each recessed second sacrificial semiconductor material nanosheet of the logic device nanosheet material stack.

Referring now to FIG. 5, there is illustrated the exemplary semiconductor structure of FIG. 4 after forming a first inner dielectric spacer 26L on exposed sidewalls of each recessed first sacrificial semiconductor material nanosheet 16R of the I/O device nanosheet material stack, NS1, and a second inner dielectric spacer 26R on exposed sidewalls of each recessed second sacrificial semiconductor material nanosheet 12R of the logic device nanosheet material stack, NS2. The first and second inner dielectric spacer (26L, 26R) are formed in each of the gaps (24L, 24R) by depositing an inner dielectric spacer material and etching the deposited inner dielectric spacer material. In one example, the inner dielectric spacer material is composed of silicon nitride.

Each first inner dielectric spacer 26L has an inner sidewall that directly contacts a sidewall of one of the recessed first sacrificial semiconductor material nano sheet 16R, and an outer sidewall that is vertically aligned to an outermost sidewall of each first semiconductor channel material nanosheet 18NS. Each second inner dielectric spacer 26R has an inner sidewall that directly contacts a sidewall of one of the recessed second sacrificial semiconductor material nanosheets 12R, and an outer sidewall that is vertically aligned to an outermost sidewall each second semiconductor channel material nanosheet 14NS.

Figure 6:
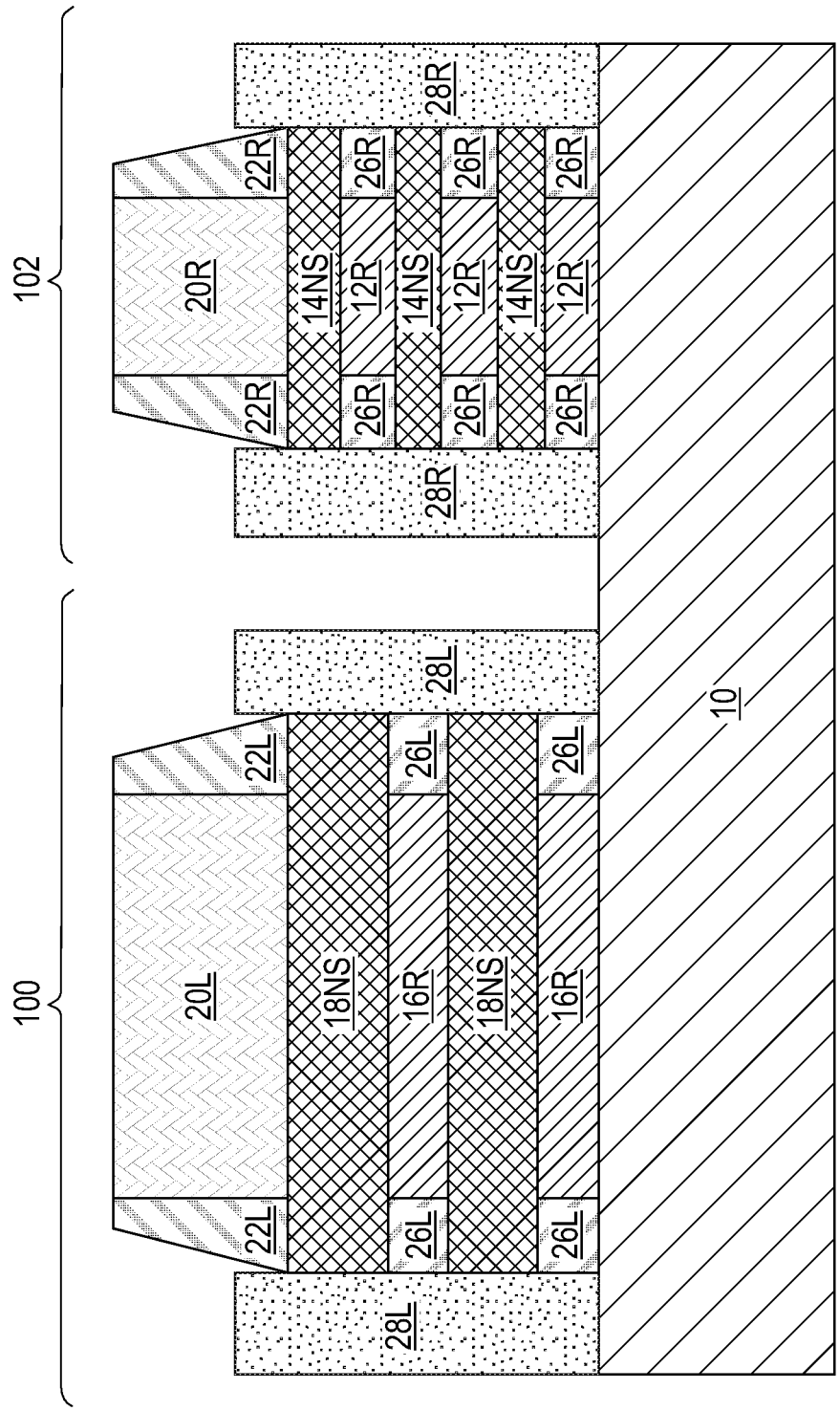
FIG. 6 is a cross sectional view of the exemplary semiconductor structure of FIG. 5 after forming a first source/drain structure on each side of the I/O device nanosheet material stack, and a second source/drain structure on each side of the logic device nanosheet material stack.

Referring now to FIG. 6, there is illustrated the exemplary semiconductor structure of FIG. 5 after forming a first source/drain structure 28L on each side of the I/O device nanosheet material stack, NS1, and a second source/drain structure 28R on each side of the logic device nanosheet material stack, NS2. The first source/drain structure 28L is in direct contact with sidewalls of each first semiconductor channel material nanosheet 18NS, while the second source/drain structure 28R is in direct physical contact with sidewalls of each second semiconductor channel material nanosheet 14NS.

The first and second source/drain structures (28L, 28R) include a semiconductor material having semiconducting properties, such as, for example, silicon or a silicon germanium alloy, and a dopant. The first and second source/drain structures (28L, 28R) may be composed of a same or different semiconductor material. The dopant that is present in the first and second source/drain structures (28L, 28R) can be either a p-type dopant or an n-type dopant. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of dopant within the first and second source/drain structures (28L, 28R) is typically from 5E19 atoms/cm$^3$ to 3E21 atoms/cm$^3$.

The first and second source/drain structures (28L, 28R) can be formed utilizing an epitaxial growth process as defined above. In the present application, the first source/drain structure 28L grows laterally outward from the exposed sidewalls of each first semiconductor channel material nanosheet 18NS, while the second source/drain structure 28R grows laterally outward from the exposed sidewalls of each second semiconductor channel material nanosheet 14NS. In one embodiment, the dopant that can be present in the first and second source/drain structures (28L, 28R) can be introduced into the precursor gas that provides first and second source/drain structures (28L, 28R). In another embodiment, the dopant can be introduced into an intrinsic semiconductor layer by utilizing one of ion implantation or gas phase doping. In one example, each first and second source/drain structures (28L, 28R) comprises a silicon germanium alloy that is doped with a p-type dopant such as, for example, boron.

Figure 7:
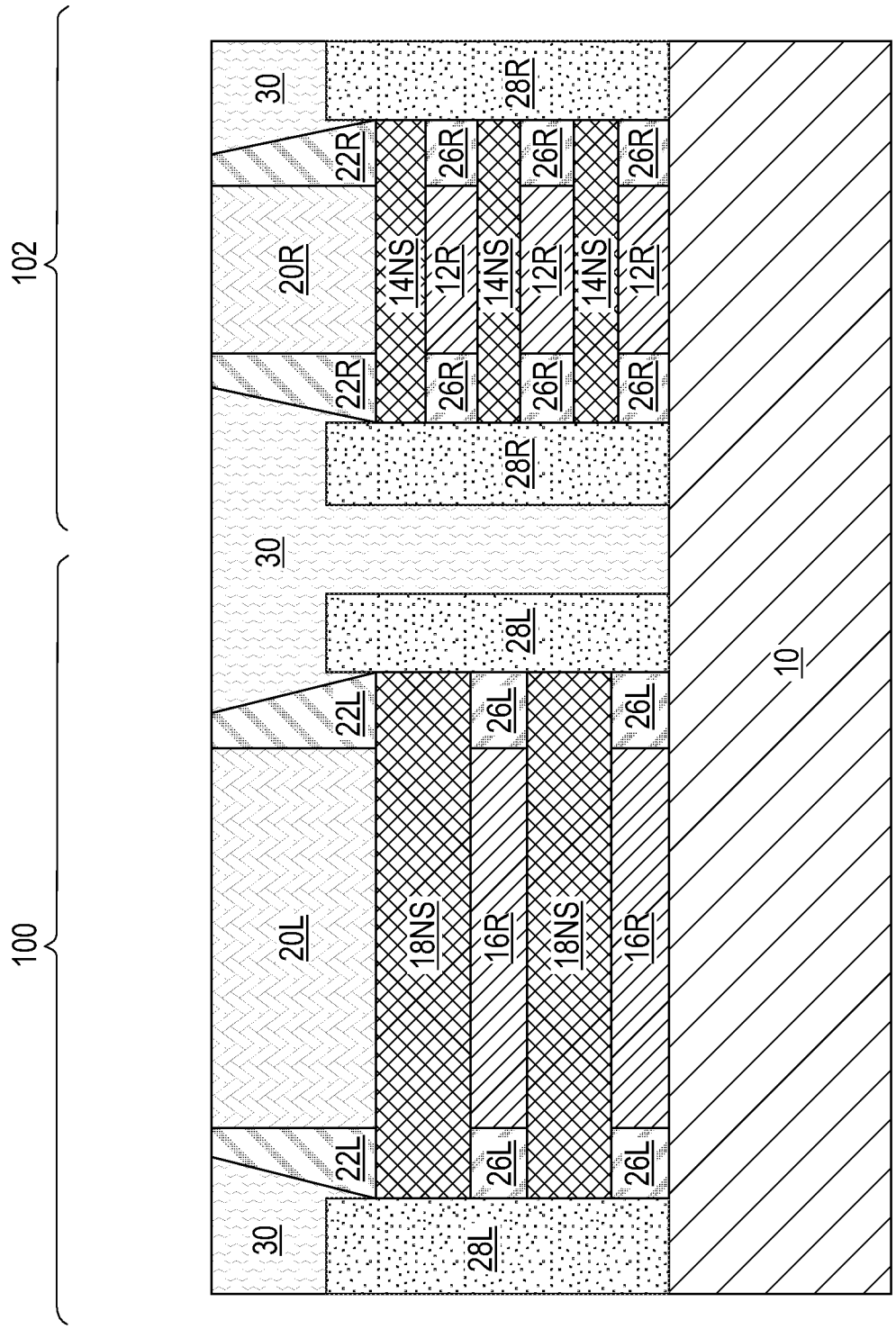
FIG. 7 is a cross sectional view of the exemplary semiconductor structure of FIG. 6 after forming an interlayer dielectric (ILD) material layer on the first and second source/drain structures.

Referring now to FIG. 7, there is illustrated the exemplary semiconductor structure of FIG. 6 after forming an interlayer dielectric (ILD) material layer 30 on the first and second source/drain structures (28L, 28R). The ILD material layer 30 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 30. The use of a self-planarizing dielectric material as the ILD material layer 30 may avoid the need to perform a subsequent planarizing step.

In one embodiment, the ILD material layer 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material layer 30, a planarization process or an etch back process follows the deposition of the dielectric material that provides the ILD material layer 30. As is shown, the ILD material layer 30 has a topmost surface that is coplanar with a topmost surface of the first and second sacrificial gate structures (20L, 20R), and the first and second dielectric material spacers (22L, 22R).

Figure 8:
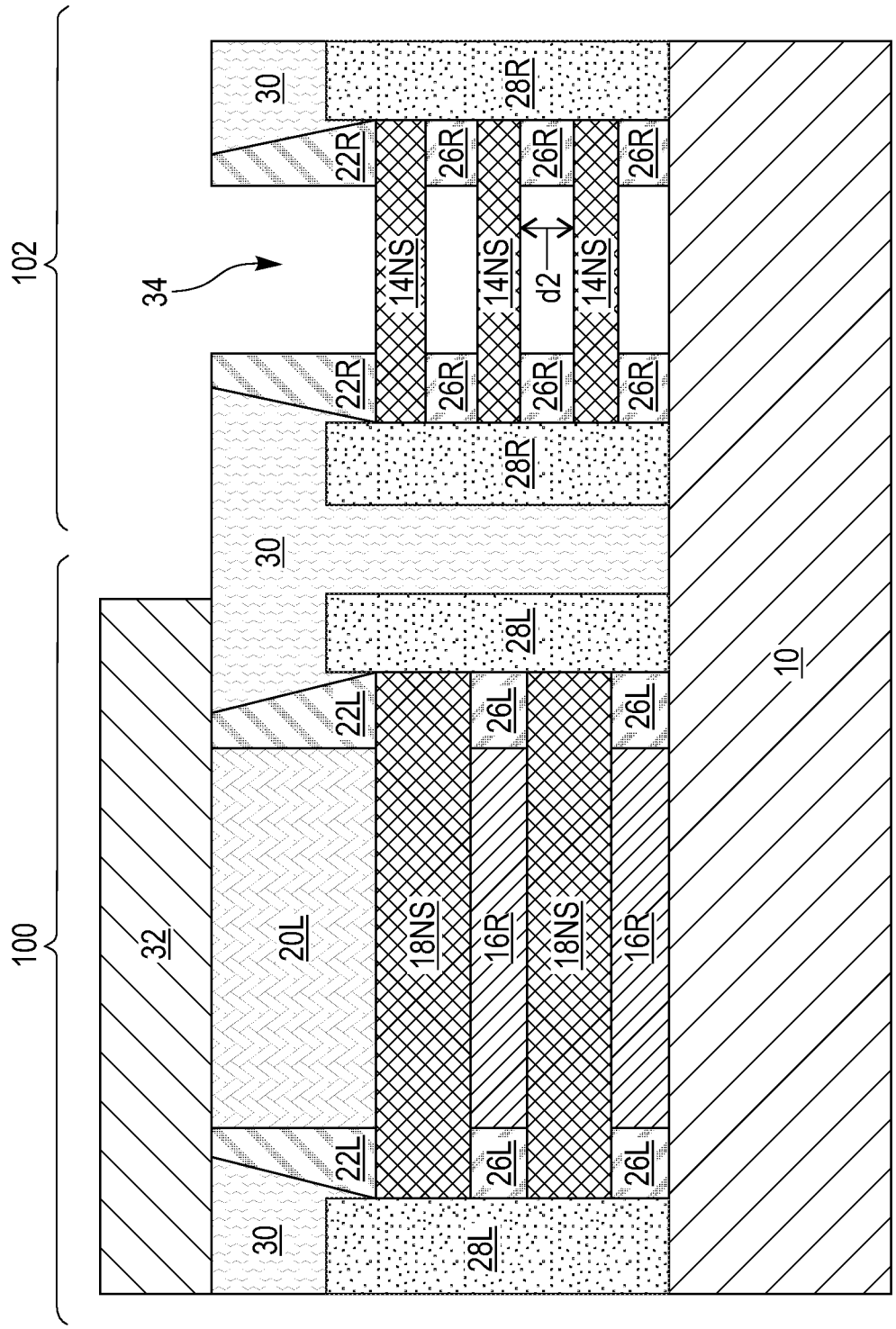
FIG. 8 is a cross sectional view of the exemplary semiconductor structure of FIG. 7 after forming a first block mask over the I/O device region, and after removing the second sacrificial gate structure and each recessed second sacrificial semiconductor material nanosheet of the logic device nanosheet material stack.

Referring now to FIG. 8, there is illustrated the exemplary semiconductor structure of FIG. 7 after forming a first block mask 32 over the I/O device region 100, and after removing the second sacrificial gate structure 20R and each recessed second sacrificial semiconductor material nanosheet 12R of the logic device nanosheet material stack, NS2. It is noted that although the present application describes and illustrates the processing of the logic device region 102 prior to the processing of the I/O device region 100, the present application works equally well when the I/O device region 100 is processed prior to the processing of the logic device region 102.

First block mask 32 may be composed of any block mask material such as, for example, one of the hard mask materials mentioned above. The first block mask 32 may be formed by deposition of the block mask material followed by lithography and etching.

The removal of the second sacrificial gate structure 20R may be performed utilizing an anisotropic etching process, such as, for example, reactive ion etching. Each recessed second sacrificial semiconductor material nanosheet 12R can be removed utilizing an etching process. Suspended second semiconductor channel material nanosheet 14NS are formed. At this point of the present application, each suspended second semiconductor channel material nanosheet 14NS has a constant vertical thickness as measured from a topmost surface of a suspended second semiconductor channel material nanosheet 14NS to a bottommost surface of the same suspended second semiconductor channel material nanosheet 14NS. Gate cavity 34 is formed in the logic device region 102. As is shown in FIG. 8, each neighboring pair of suspended second semiconductor channel material nanosheet 14NS is spaced apart from each other by a second inter-nanosheet spacing distance, d2. In the present application, d2 is from 5 nm to 15 nm, i.e., the vertical thickness of the removed recessed second sacrificial semiconductor material 12R.

Figure 9:
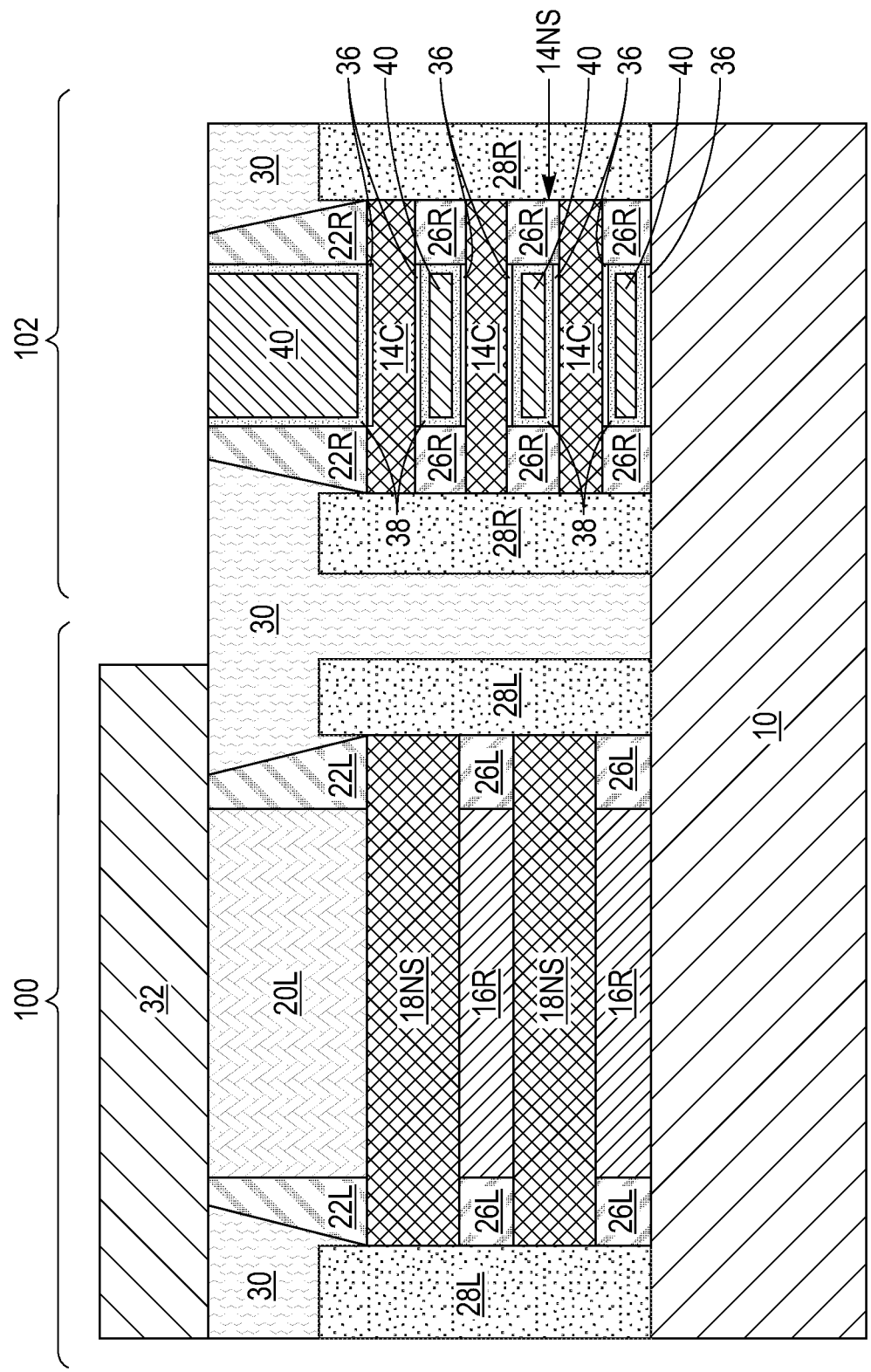
FIG. 9 is a cross sectional view of the exemplary semiconductor structure of FIG. 8 after forming a logic device functional gate structure wrapping around a channel region of each second semiconductor channel material nanosheet of the logic device nanosheet material stack.

Referring now to FIG. 9, there is illustrated the exemplary semiconductor structure of FIG. 8 after forming a logic device functional gate structure (36, 38, 40) wrapping around a channel region 18C of each second semiconductor channel material nanosheet 14NS of the logic device nanosheet material stack, NS2. The logic device functional gate structure includes a logic device interfacial portion 36, a logic device gate dielectric portion 38 and a logic device gate conductor portion 40.

At this point of the present application and due to the formation of the logic device interfacial portion 36, each second semiconductor channel material nanosheet 14NS has a channel region 14C whose thickness is less than the thickness of end portions of each second semiconductor channel material nanosheet 14NS; this reduction in channel thickness is negligible as compared to the intentional thinning of the first semiconductor channel material nanosheets 18NS to be described in greater detail herein below. In one example, the channel region 18C has a thickness from 5 nm to 10 nm, while the end regions of each second semiconductor channel material nanosheet 14NS have a thickness from 5 nm to 10 nm. Each second semiconductor channel material nanosheet 14NS may have a dumb-bell shape including a thinned channel region 14C and thicker end regions. In some embodiments and in which no interfacial portion is formed, the second semiconductor material nanosheets 14NS has a constant thickness from one end to the other end.

The logic device functional gate structure is formed into gate cavity 34 and surrounds the channel portion 18C of each second semiconductor channel material nanosheet 14NS. By "functional gate structure" it is meant a permanent gate structure used to control output current (i.e., flow of carriers in the channel) of a semiconducting device through electrical or magnetic fields.

The logic device interfacial portion 36 may include an oxide of the semiconductor material of the second semiconductor channel material nanosheet 14NS which is formed utilizing a thermal oxidation (i.e., growth) process. In one example, the oxide is silicon dioxide. The logic device interfacial portion 36 may have a thickness from 0.5 nm to 2.0 nm.

The logic device gate dielectric portion 38 may include a gate dielectric material such as, for example, an oxide, nitride, and/or oxynitride. In one example, the gate dielectric material that provides the logic device gate dielectric portion 38 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The gate dielectric material that provides the logic device gate dielectric portion 38 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the logic device gate dielectric portion 38 can have a thickness in a range from 1 nm to 10 nm. Other thicknesses that are lesser than, or greater than, the aforementioned thickness range can also be employed for the gate dielectric material that may provide the logic device gate dielectric portion 38.

The logic device gate conductor portion 40 is composed of a gate conductor material. The gate conductor material can be composed of any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the logic device gate conductor portion 40 may comprise an nFET gate metal. In another embodiment, the logic device gate conductor portion 40 may comprise a pFET gate metal. The gate conductor material that provides the logic device gate conductor portion 40 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material can have a thickness from 50 nm to 200 nm. Other thicknesses that are lesser than, or greater than, the aforementioned thickness range can also be employed for the gate conductor material.

The logic device functional gate structure can be formed by providing a logic device functional gate material stack of an interfacial material as mentioned above, a gate dielectric material as mentioned above, and a gate conductor material as mentioned above. A planarization process may follow the formation of the logic device functional gate material stack.

Figure 10:
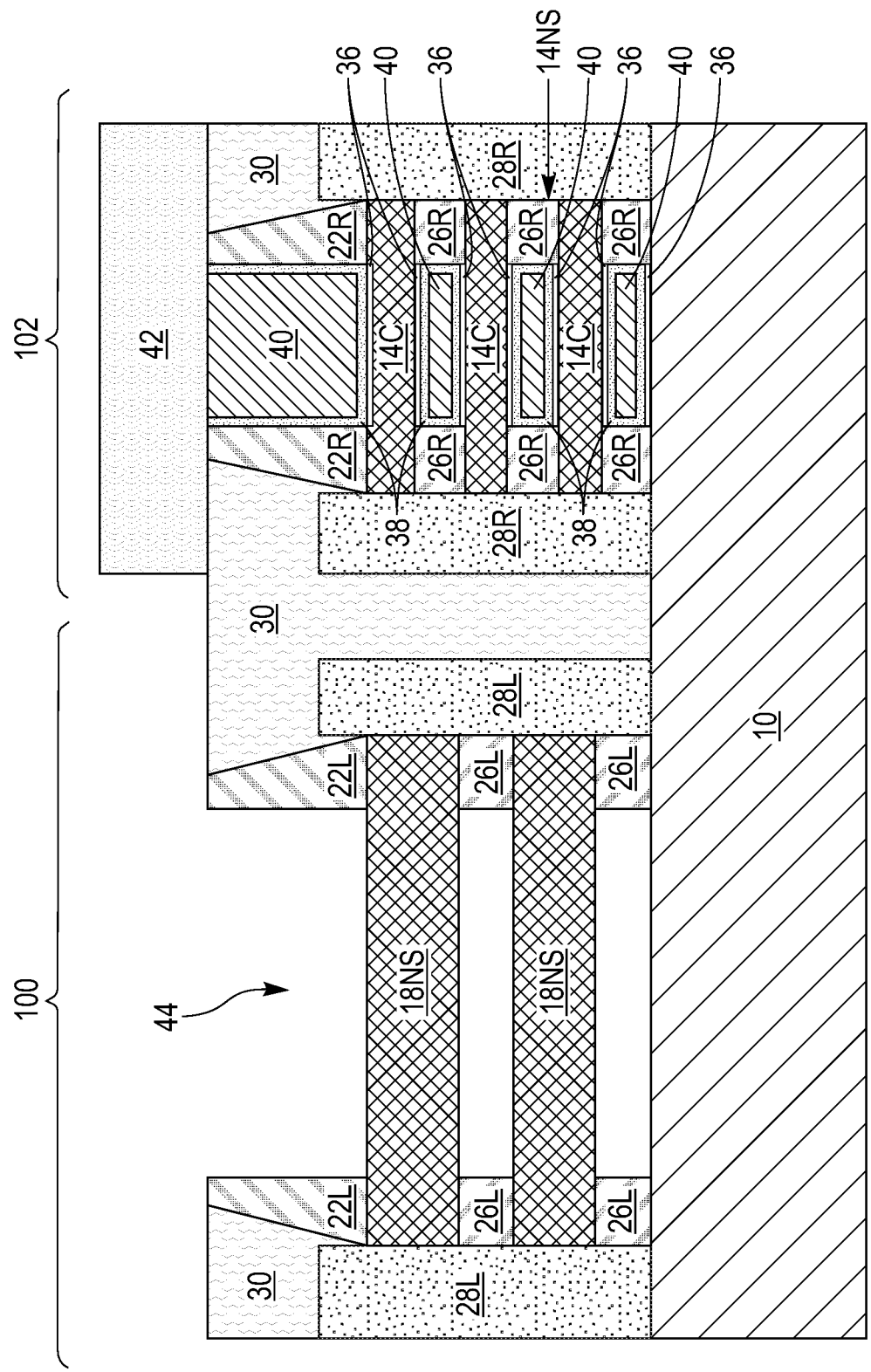
FIG. 10 is a cross sectional view of the exemplary semiconductor structure of FIG. 9 after removing the first block mask over the I/O device region, forming a second block mask over the logic device region, and after removing the first sacrificial gate structure and each recessed first sacrificial semiconductor material nanosheet of the I/O device nanosheet material stack.

Referring now to FIG. 10, there is illustrated the exemplary semiconductor structure of FIG. 9 after removing the first block mask 32 over the I/O device region 100, forming a second block mask 42 over the logic device region 102, and after removing the first sacrificial gate structure 20L and each recessed first sacrificial semiconductor material nanosheet 16R of the I/O device nanosheet material stack, NS1.

The removal of the first block mask 32 may include any material removal process such as, for example, etching or chemical mechanical polishing, that is selective in removing the block mask material that provides the first block mask 32.

Second block mask 42 may be composed of any block mask material such as, for example, one of the hard mask materials mentioned above. The second block mask 42 may be formed by deposition of the block mask material followed by lithography and etching.

The removal of the first sacrificial gate structure 20L may be performed utilizing an anisotropic etching process, such as, for example, reactive ion etching. Each recessed first sacrificial semiconductor material nanosheet 16R can be removed utilizing an etching process. Suspended first semiconductor channel material nanosheets 18NS are formed. At this point of the present application, each suspended first semiconductor channel material nanosheet 18NS has a constant vertical thickness as measured from a topmost surface of a suspended first semiconductor channel material nanosheet 18NS to a bottommost surface of the same suspended first semiconductor channel material nanosheet 18NS. Gate cavity 44 is formed in the I/O device region 100.

Figure 11:
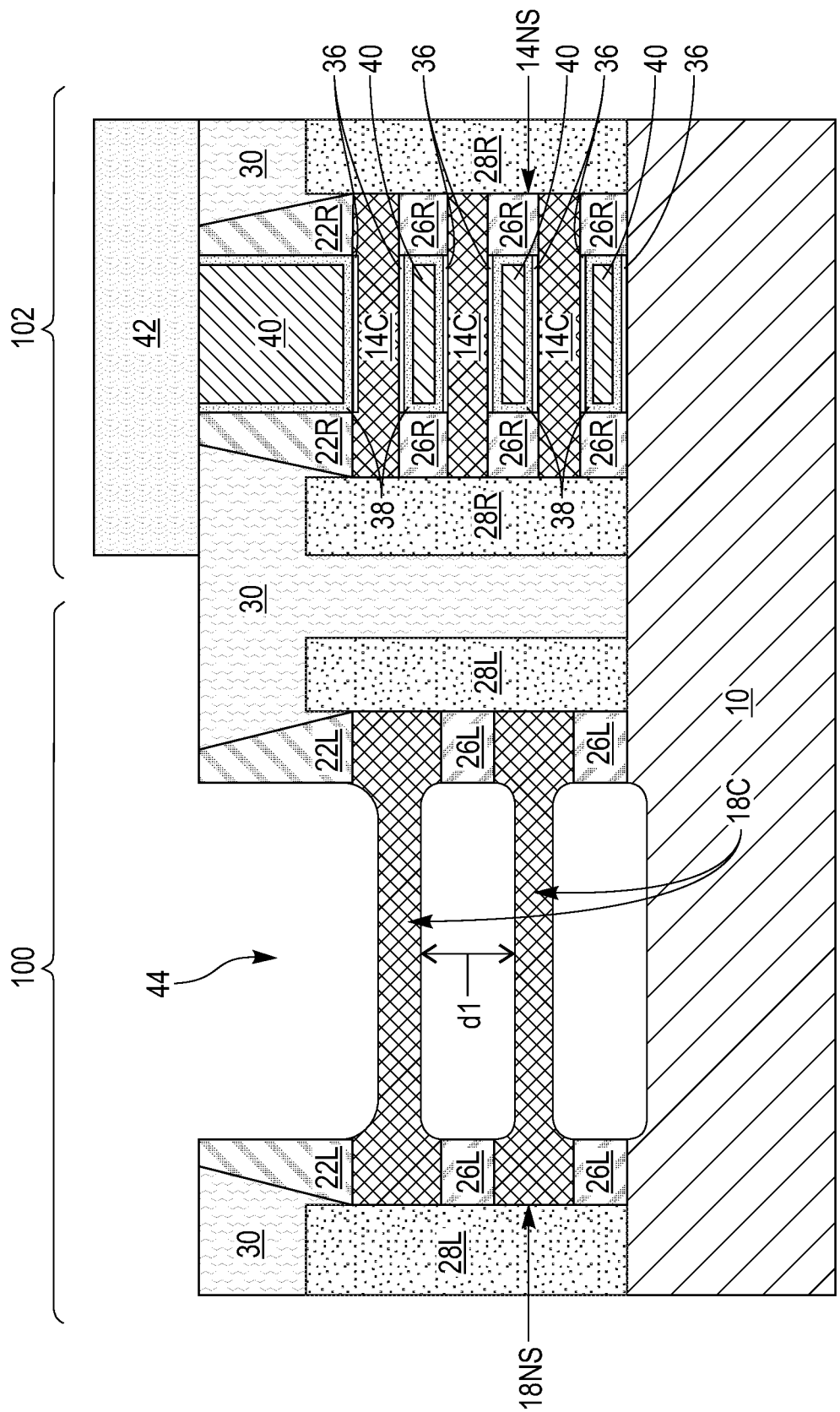
FIG. 11 is a cross sectional view of the exemplary semiconductor structure of FIG. 10 after intentionally thinning physically exposed portions of each first semiconductor channel material nanosheet of the I/O device nanosheet material stack.

Referring now to FIG. 11, there is illustrated the exemplary semiconductor structure of FIG. 10 after intentionally thinning physically exposed portions of each first semiconductor channel material nanosheet 18NS of the I/O device nanosheet material stack, NS1. This intentional thinning of the physically exposed portions of each first semiconductor channel material nanosheet 18NS of the I/O device nanosheet material stack, NS1, may be performed utilizing oxidation (by thermal annealing) and etching. The oxidation and etching may be performed any number of times to provided a desired vertical thickness to the physically exposed portions of each first semiconductor channel material nanosheet 18NS of the I/O device nanosheet material stack, NS1. This step also serves to increase the volume of gate cavity 44 in the I/O device region 100.

The physically exposed portions of each first semiconductor channel material nanosheet 18NS of the I/O device nanosheet material stack, NS1, that undergo thinning provides a channel region 18C of the first semiconductor channel material nanosheet 18NS of the I/O device nanosheet material stack, NS1. At this point of the present application, each first semiconductor channel material nanosheet 18NS has a channel region 18C whose thickness is less than the thickness of end regions of each second semiconductor channel material nanosheet 14NS. In one example, the channel region 18C has a thickness from 5 nm to 10 nm, while the end portions of each first semiconductor channel material nanosheet 18NS have a thickness from 12 nm to 20 nm. Each first semiconductor channel material nanosheet 18NS has a dumb-bell shape including a thinned channel region 18C and thicker end regions.

After thinning and as is shown in FIG. 9, each neighboring pair of suspended and thinned first semiconductor channel material nanosheet 18NS is spaced apart from each other by a first inter-nanosheet spacing distance, d1, which is greater than d2. In the present application, d1 is from 12 nm to 25 nm.

Figure 12:
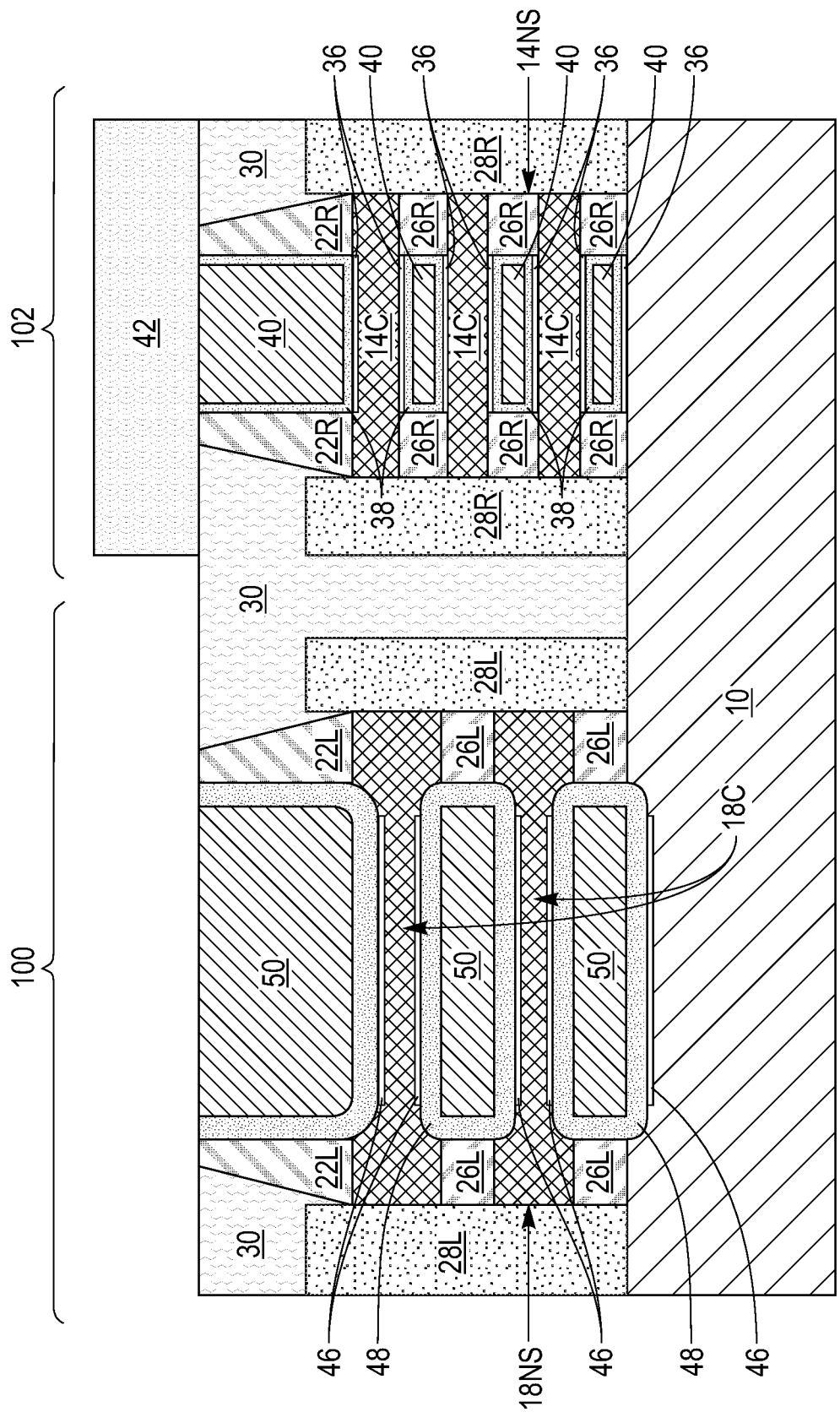
FIG. 12 is a cross sectional view of the exemplary semiconductor structure of FIG. 11 after forming an I/O device functional gate structure wrapping around the thinned portion (i.e., channel portion) of each first semiconductor channel material nanosheet.

Referring now to FIG. 12, there is illustrated the exemplary semiconductor structure of FIG. 11 after forming an I/O device functional gate structure (46, 48, 50) wrapping around the thinned portion (i.e., channel region 18C) of each first semiconductor channel material nanosheet 18NS. The I/O device functional gate structure has a longer channel length than the channel length of the logic device functional gate structure.

The I/O device functional gate structure includes an I/O device interfacial portion 46, an I/O device gate dielectric portion 48 and an I/O gate conductor portion 50. The I/O device interfacial portion 46 may include an oxide of the semiconductor material of the first semiconductor channel material nanosheet 18NS. The I/O device interfacial portion 46 may be composed of a same, or different, interfacial oxide as the logic device interfacial portion 36. The I/O device interfacial portion 46 may be formed by thermal oxidation, and it may have a thickness in the range mentioned above for the logic device interfacial portion 36. During the formation of the I/O device interfacial portion 46, some additional thinning of the channel region 18C may occur. Such thinning is trivial in compassion to the thinning that is achieved by oxidation and etching as described above. In some embodiments, interfacial portions are not formed in at least one of the device regions.

The I/O device gate dielectric portion 48 may include one of the gate dielectric materials mentioned above for the logic device gate dielectric portion 38. In one embodiment, the I/O device gate dielectric portion 48 is composed of a same gate dielectric material as the logic device gate dielectric portion 38. In another embodiment, the I/O device gate dielectric portion 48 is composed of a different gate dielectric material than the logic device gate dielectric portion 38. The gate dielectric material that provides the I/O device gate dielectric portion 48 may be formed utilizing one of the deposition techniques mentioned above for forming the gate dielectric material of the logic device gate dielectric portion 38. Due to the increased volume of gate cavity 44, the I/O device gate dielectric portion 48 has a thickness that is greater than the thickness of the logic device gate dielectric portion 38. In one example, the thickness of the I/O device gate dielectric portion 48 is from 3 nm to 6 nm.

The I/O device gate conductor portion 50 may include one of the gate conductor materials mentioned above for the logic device gate conductor portion 40. In one embodiment, the I/O device gate conductor portion 50 is composed of a same gate conductor material as the logic device gate conductor portion 40. In another embodiment, the I/O device gate conductor portion 50 is composed of a different gate conductor material than the logic device gate conductor portion 40. The gate conductor material that provides the I/O device gate conductor portion 50 may be formed utilizing one of the deposition techniques mentioned above for forming the gate conductor material of the logic device gate conductor portion 40.

Figure 13:
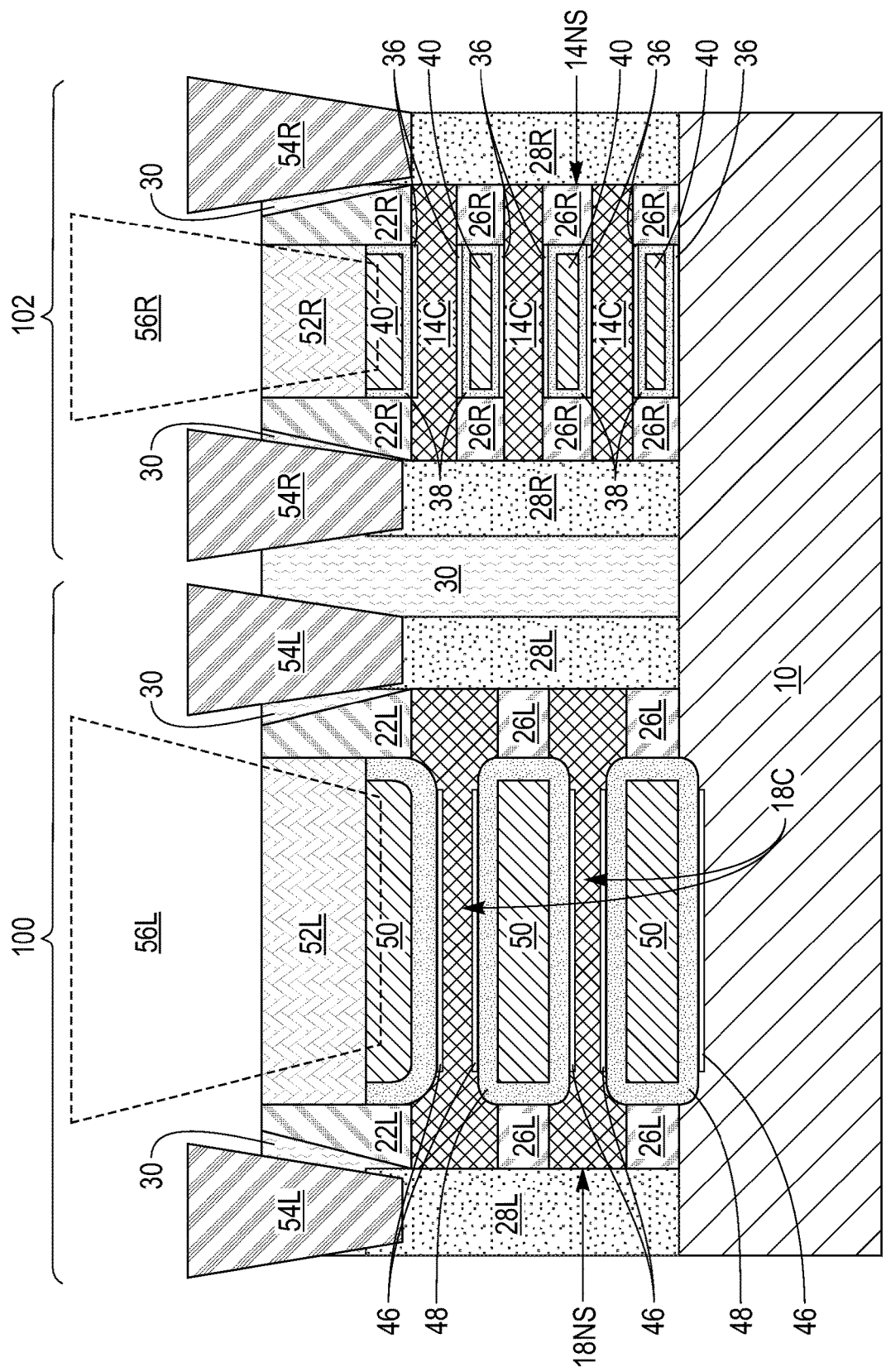
FIG. 13 is a cross sectional view of the exemplary semiconductor structure of FIG. 12 after removing the second block mask, and after forming first source/drain contact structures and a first gate contact structure in the I/O device region, and second source/drain contact structures and a second gate contact structure in the logic device region.

Referring now to FIG. 13, there is illustrated the exemplary semiconductor structure of FIG. 12 after removing the second block mask 42, and after forming first source/drain contact structures 54L and a first gate contact structure 56L in the I/O device region 100, and second source/drain contact structures 54R and a second gate contact structure 56R in the logic device region 102. It is noted that in the illustrated embodiment, the first and second gate contact structures (56L, 56R) are formed behind first and second gate caps (52L, 52R), respectively, thus they are illustrated by dotted lines.

The second block mask 42 may be removed utilizing a material removal process that is selective in removing the block mask material that provides the second block mask 42.

In some embodiments, the upper portion of the I/O device and the logic device functional gate structures that is positioned between the corresponding spacer dielectric material layer (22L, 22R) is recessed and a gate cap is formed into the recessed area. The gate cap in the I/O device region 100 is referred to herein as a first gate cap 52L, while the gap cap in the logic device region 102 is referred to herein as a second gate cap 52R. The first and second gate caps (52L, 52R) may include one of the materials mentioned above for the sacrificial dielectric cap. The first and second gate gaps (52L, 52R) may be formed by deposition, followed by a planarization process.

The various contact structures (54L, 56L, 54R, 56R) can be formed by first providing contact openings to expose a conductive region (i.e., the first source/drain structure 28L, the first gate conductor portion 50, the second source/drain structure 28R, and the second gate conductor portion 40) of the structure. The contact openings can be formed by lithography and etching. Each contact opening is the filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of stacked and suspended first semiconductor channel material nanosheets located above a semiconductor substrate and present in an I/O device region, wherein each first semiconductor channel material nanosheet has a channel region having a thickness that is less than a thickness of each end region of the first semiconductor channel material nanosheet;
a I/O device functional gate structure wrapping around the channel region of each first semiconductor channel material nanosheet of the plurality of stacked and suspended first semiconductor channel material nanosheets, wherein a lower portion of the I/O device functional gate structure that is located beneath a bottommost first semiconductor channel material nanosheet of the plurality of stacked and suspended first semiconductor channel material nanosheets extends beneath a topmost surface of the semiconductor substrate; and
a source/drain (S/D) structure on each side of the I/O device functional gate structure and physically contacting sidewalls of each first semiconductor channel material nanosheet of the plurality of stacked and suspended first semiconductor channel material nanosheets.

2. The semiconductor structure of claim 1, wherein each neighboring pair of suspended first semiconductor channel material nanosheets has an inter-nanosheet spacing distance of from 5 nm to 15 nm.

3. The semiconductor structure of claim 1, further comprising an inner dielectric spacer contacting a sidewall of the I/O device functional gate structure.

4. The semiconductor structure of claim 1, further comprising an interlevel dielectric (ILD) material layer located above the source/drain structure.

5. The semiconductor structure of claim 1, further comprising a source/drain contact structure contacting a surface of the source/drain structure, and a gate contact structure contacting a surface of a gate conductor portion of the I/O device functional gate structure.

6. The semiconductor structure of claim 1, wherein the I/O device functional gate structure comprises an I/O device interfacial portion, an I/O device gate dielectric portion and an I/O device gate conductor portion.

7. The semiconductor structure of claim 1, further comprising a logic device region located laterally adjacent to the I/O device region, wherein the logic device region comprises;
a plurality of stacked and suspended second semiconductor channel material nanosheets located on the semiconductor substrate, wherein a logic device functional gate structure wraps around a channel region of each second semiconductor channel material nanosheet of the plurality of stacked and suspended second semiconductor channel material nanosheets, and another source/drain (S/D) structure is located on each side of the logic device functional gate structure and physically contacting sidewalls of each second semiconductor channel material nanosheet of the plurality of stacked and suspended second semiconductor channel material nanosheets.

8. The semiconductor structure of claim 7, wherein each neighboring pair of suspended second semiconductor channel material nanosheets of the plurality of stacked and suspended second semiconductor channel material nanosheets has a second inter-nanosheet spacing distance that is less than a first inter-nanosheet spacing distance of each neighboring pair of suspended first semiconductor channel material nanosheets.

9. The semiconductor structure of claim 8, wherein the first inter-nanosheet spacing distance is from 5 nm to 15 nm and the second inter-nanosheet spacing distance is from 12 nm to 25 nm.

10. The semiconductor structure of claim 7, further comprising a source/drain contact structure contacting a surface of the another source/drain structure, and a gate contact structure contacting a surface of a gate conductor portion of the logic device functional gate structure.

11. The semiconductor structure of claim 7, wherein the logic device functional gate structure comprises a logic interfacial portion, a logic device gate dielectric portion and a logic device gate conductor portion.

12. A semiconductor structure comprising:
- a plurality of stacked and suspended first semiconductor channel material nanosheets located above a semiconductor substrate and present in an I/O device region, wherein each first semiconductor channel material nanosheet has a channel region having a thickness that is less than a thickness of each end region of the first semiconductor channel material nanosheet;
- a I/O device functional gate structure wrapping around the channel region of each first semiconductor channel material nanosheet of the plurality of stacked and suspended first semiconductor channel material nanosheets, wherein the I/O device functional gate structure comprises an interfacial oxide portion that is located on an entirety of a topmost surface and a bottommost surface of the channel region of each first semiconductor channel material nanosheet of the plurality of stacked and suspended first semiconductor channel material nanosheets, and wherein a lower portion of the I/O device functional gate structure that is located beneath a bottommost first semiconductor channel material nanosheet of the plurality of stacked and suspended first semiconductor channel material nanosheets extends beneath a topmost surface of the semiconductor substrate; and
- a source/drain (S/D) structure on each side of the I/O device functional gate structure and physically contacting sidewalls of each first semiconductor channel material nanosheet of the plurality of stacked and suspended first semiconductor channel material nanosheets.

* * * * *